United States Patent
Takiguchi et al.

(10) Patent No.: US 9,793,681 B2
(45) Date of Patent: Oct. 17, 2017

(54) SEMICONDUCTOR LASER DEVICE

(71) Applicant: HAMAMATSU PHOTONICS K.K., Hamamatsu-shi, Shizuoka (JP)

(72) Inventors: Yuu Takiguchi, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/903,466

(22) PCT Filed: Jul. 2, 2014

(86) PCT No.: PCT/JP2014/067712
§ 371 (c)(1),
(2) Date: Jan. 7, 2016

(87) PCT Pub. No.: WO2015/008627
PCT Pub. Date: Jan. 22, 2015

(65) Prior Publication Data
US 2016/0380405 A1    Dec. 29, 2016

(30) Foreign Application Priority Data
Jul. 16, 2013    (JP) .................................. 2013-147904

(51) Int. Cl.
*H01S 5/026*    (2006.01)
*H01S 5/12*    (2006.01)
(Continued)

(52) U.S. Cl.
CPC .............. *H01S 5/026* (2013.01); *G02F 1/137* (2013.01); *G02F 1/29* (2013.01); *H01S 5/12* (2013.01);
(Continued)

(58) Field of Classification Search
CPC .............................. G02F 1/137; H01S 5/0265
See application file for complete search history.

(56) References Cited

U.S. PATENT DOCUMENTS

| | | | | |
|---|---|---|---|---|
| 5,301,201 A | * | 4/1994 | Dutta | G02F 1/29 372/101 |
| 7,203,210 B2 | * | 4/2007 | Sox | G02B 27/0087 372/26 |
| 2005/0249256 A1 | * | 11/2005 | He | H01S 5/06256 372/50.1 |

FOREIGN PATENT DOCUMENTS

| | | |
|---|---|---|
| JP | H02-267988 A | 11/1990 |
| JP | H09-64334 A | 3/1997 |

(Continued)

OTHER PUBLICATIONS

International Preliminary Report on Patentability dated Jan. 28, 2016 for PCT/JP2014/067712.

(Continued)

*Primary Examiner* — Tuan Nguyen
(74) *Attorney, Agent, or Firm* — Drinker Biddle & Reath LLP

(57) ABSTRACT

This semiconductor laser device includes a semiconductor laser chip and a spatial light modulator SLM which is optically connected to the semiconductor laser chip. The semiconductor laser chip LDC includes an active layer 4, a pair of cladding layers 2 and 7 sandwiching the active layer 4, and a diffraction grating layer 6 which is optically connected to the active layer 4. The spatial light modulator SLM includes a common electrode 25, a plurality of pixel electrodes 21, and a liquid crystal layer LC arranged between the common electrode 25 and the pixel electrodes 21. A laser beam output in a thickness direction of the (Continued)

diffraction grating layer 6 is modulated and reflected by the spatial light modulator SLM and is output to the outside.

10 Claims, 11 Drawing Sheets

(51) Int. Cl.
*H01S 5/187* (2006.01)
*G02F 1/137* (2006.01)
*G02F 1/1335* (2006.01)
*G02F 1/29* (2006.01)
*H01S 5/00* (2006.01)
*H01S 5/343* (2006.01)

(52) U.S. Cl.
CPC .......... *H01S 5/187* (2013.01); *H01S 5/34313* (2013.01); *H01S 5/34353* (2013.01); *G02F 1/1335* (2013.01); *G02F 2001/291* (2013.01); *G02F 2201/305* (2013.01); *G02F 2202/32* (2013.01); *G02F 2203/02* (2013.01); *G02F 2203/12* (2013.01); *G02F 2203/18* (2013.01); *G02F 2203/50* (2013.01); *H01S 5/0085* (2013.01); *H01S 5/3432* (2013.01)

(56) References Cited

FOREIGN PATENT DOCUMENTS

| | | |
|---|---|---|
| JP | 2000-332351 A | 11/2000 |
| JP | 2004-253811 A | 9/2004 |
| JP | 2004-296538 A | 10/2004 |
| JP | 2004296538 * | 10/2004 ......... H01S 5/18355 |
| JP | 2010-219307 A | 9/2010 |
| WO | WO-2012/110811 A2 | 8/2012 |

OTHER PUBLICATIONS

Eiji Miyai, et al., "Lasers producing tailored beams", Nature, vol. 441, 2006, Jun. 22, 2006, p. 946.

Kyosuke Sakai, et al., "Optical trapping of metal particles in doughnut-shaped beam emitted by photonic-crystal laser", Electronics Letters, vol. 43, No. 2, Jan. 18, 2007, p. 107-p. 108.

* cited by examiner

SEMICONDUCTOR LASER DEVICE

TECHNICAL FIELD

The present invention relates to a semiconductor laser device.

BACKGROUND ART

Patent Literature 1 discloses a surface-emission laser element having a two-dimensional periodic structure. The surface-emission laser element includes a photonic crystal layer. The photonic crystal layer disclosed in the literature has a structure in which through-holes are periodically provided in orthogonal two directions. Non Patent Literature 1 discloses an example of inserting a phase shift region, which has a period different from its surrounding, between hole-formed regions. By using a phase shift region, it is possible to acquire a beam pattern different from that in a case where the phase shift region is not used. Specifically, an annular beam is effective to optical tweezers and the like. With an ordinary single-peak beam, it is difficult to acquire an opaque substance but the annular beam can be also used for acquisition of an opaque substance (Non Patent Literature 2). Note that Non Patent Literature 2 discloses a projector using a surface-emission laser element. Generally, a projector is a device to form an intended image by selectively transmitting/cutting a beam in each pixel but is not what controls a phase of a wave front of each pixel.

When a phase of a wave front of a laser beam, which has a two-dimensional spread, in each minute region can be controlled, it is possible to acquire an intended image by superimposition of wave fronts of minute regions. Since a Fourier transformed near-field image of a laser beam with a two-dimensional spread is a far-field image of a laser, such a semiconductor laser device can be expected to be applied in various manners. It has been known that a reproduced image is acquired when Fourier transform is performed with respect to a hologram. Thus, such a device is expected to be used for designing of a hologram or the like. Also, a Fourier transformed image is used for image processing, pattern matching, or the like in an inspection device.

CITATION LIST

Patent Literature

Patent Literature 1: Japanese Patent Application Laid-Open No. 2000-332351
Patent Literature 2: Japanese Patent Application Laid-Open No, 2010-219307

Non Patent Literature

Non Patent Literature 1: Eiji Miyai, et al, "Lasers producing tailored beams." Nature 441. (2006): p. 946.
Non Patent Literature 2: Kyosuke Sakai, et al. "Optical trapping of metal particles in doughnut-shaped beam emitted by photonic-crystal laser," Electronics Letters 43. (2007): pp. 107-108.

SUMMARY OF INVENTION

Technical Problem

However, conventionally, a semiconductor laser device which can perform wave front control, that is, phase control of each minute region has not been known. Thus, it has not been possible to freely superimpose wave fronts and to form an intended variable laser beam pattern by a semiconductor laser device. The present invention is provided in view of such problems and is to provide a semiconductor laser device which can form an intended variable laser beam pattern.

Solution to Problem

In order to solve the above-described problem, a semiconductor laser device according to the present invention is a semiconductor laser device including: a semiconductor laser chip; and a spatial light modulator which is optically connected to the semiconductor laser chip, wherein the semiconductor laser chip includes an active layer, a pair of cladding layers sandwiching the active layer, and a diffraction grating layer which is optically connected to the active layer, and the spatial light modulator includes a common electrode, a plurality of pixel electrodes, and a liquid crystal layer arranged between the common electrode and the pixel electrodes, the spatial light modulator being attached to the semiconductor laser chip in such a manner that a laser beam output in a thickness direction of the diffraction grating layer is input through transparent one of the common electrode and the pixel electrodes, modulating a phase of the laser beam in each minute region with a driving voltage applied between the pixel electrodes and the common electrode, and reflecting and outputting, to the outside, the laser beam the phase of which is modulated.

The laser beam output in the thickness direction from the diffraction grating layer reaches the liquid crystal layer through the pixel electrode or the common electrode. A permittivity (refractive index) of the liquid crystal layer varies depending on voltage applied to the pixel electrode. Thus, an optical path length of the liquid crystal layer with respect to the laser beam varies and a phase varies. A phase of a laser beam reflected in such a manner as to reciprocate in the liquid crystal layer is modulated with respect to each pixel electrode. Thus, it is possible to perform wave front control of each minute region and to form an intended variable laser beam pattern by superimposition of wave fronts.

Also, the present semiconductor laser device further includes a selection circuit which is arranged on the semiconductor laser chip and which is configured to supply the driving voltage selectively between one of the pixel electrodes, where one is placed at an intended address, and the common electrode. By providing the selection circuit on the semiconductor laser chip, it is possible to control a spatial light modulator without providing a large-scale external wiring group.

Also, a storage device to store an initial correction value of the driving voltage in each of the pixel electrodes can be included. In this case, a device can output an intended pattern even when there is an in-plane variation in a phase of the spatial light modulator during production.

Also, the semiconductor laser chip includes a laser beam generation region in which the active layer is formed, and a deflection region which is adjacent to the laser beam generation region and which is configured to deflect the laser beam, the diffraction grating layer is extended, in such a manner as to be placed in both of the laser beam generation region and the deflection region, and deflects the laser beam in the thickness direction of the diffraction grating layer, and the spatial light modulator is attached to the deflection region. In this case, by separately providing a laser beam generation region and a deflection region, it is possible to optimize a characteristic in each region.

Also, the semiconductor laser chip includes a laser beam generation region in which the active layer is formed, the diffraction grating layer is placed in the laser beam generation region and emits the laser beam in the thickness direction of the diffraction grating layer, and the spatial light modulator is attached to the laser beam generation region. In this case, it is possible to downsize a device by arranging the spatial light modulator in the laser beam generation region.

Also, the present semiconductor laser device further includes a quarter wave plate arranged between the semiconductor laser chip and the spatial light modulator, and a polarizer provided on a surface of the semiconductor laser chip which surface is on an opposite side of the spatial light modulator. A polarization orientation of a laser beam which enters the spatial light modulator trough a quarter wave plate, reciprocates in the spatial light modulator, and passes through the quarter wave plate again in an opposite direction is rotated for 90°. That is, when a laser beam enters the quarter wave plate as a linearly-polarized light in a first polarization direction and passes through the quarter wave plate twice, the beam becomes linearly-polarized light in a second polarization direction rotated for 90° in the first polarization direction. Thus, when a polarization direction in a polarizer is made identical to the second polarization direction, only a laser beam which reciprocates in the spatial light modulator passes through the polarizer and a component in the other polarization direction is cut by the polarizer. Thus, a noise component which is which is not modulated by the liquid crystal layer is eliminated from an output image.

Also, the semiconductor laser chip includes a laser beam generation region in which the active layer is formed, and a deflection region which is adjacent to the laser beam generation region and which is configured to deflect the laser beam, the diffraction grating layer is extended in such a manner as to be placed in both of the laser beam generation region and the deflection region, and the deflection region is surrounded by the laser beam generation region.

Also, in this case, the spatial light modulator is attached to the deflection region.

Also, in any of the above-described structures, the diffraction grating layer includes a basic layer, and a plurality of different-refractive-index regions which is formed periodically in the basic layer and which has refractive indexes different from that of the basic layer, and a planar shape of each of the different-refractive-index regions in the diffraction grating layer in the deflection region is rotationally asymmetric.

Advantageous Effects of Invention

According to a semiconductor laser device of the present invention, it is possible to form an intended variable laser beam pattern.

DESCRIPTION OF EMBODIMENTS

In the following, a semiconductor laser device according to an embodiment will be described. The same sign is used for identical components and an overlapped description is omitted.

Figure 1:
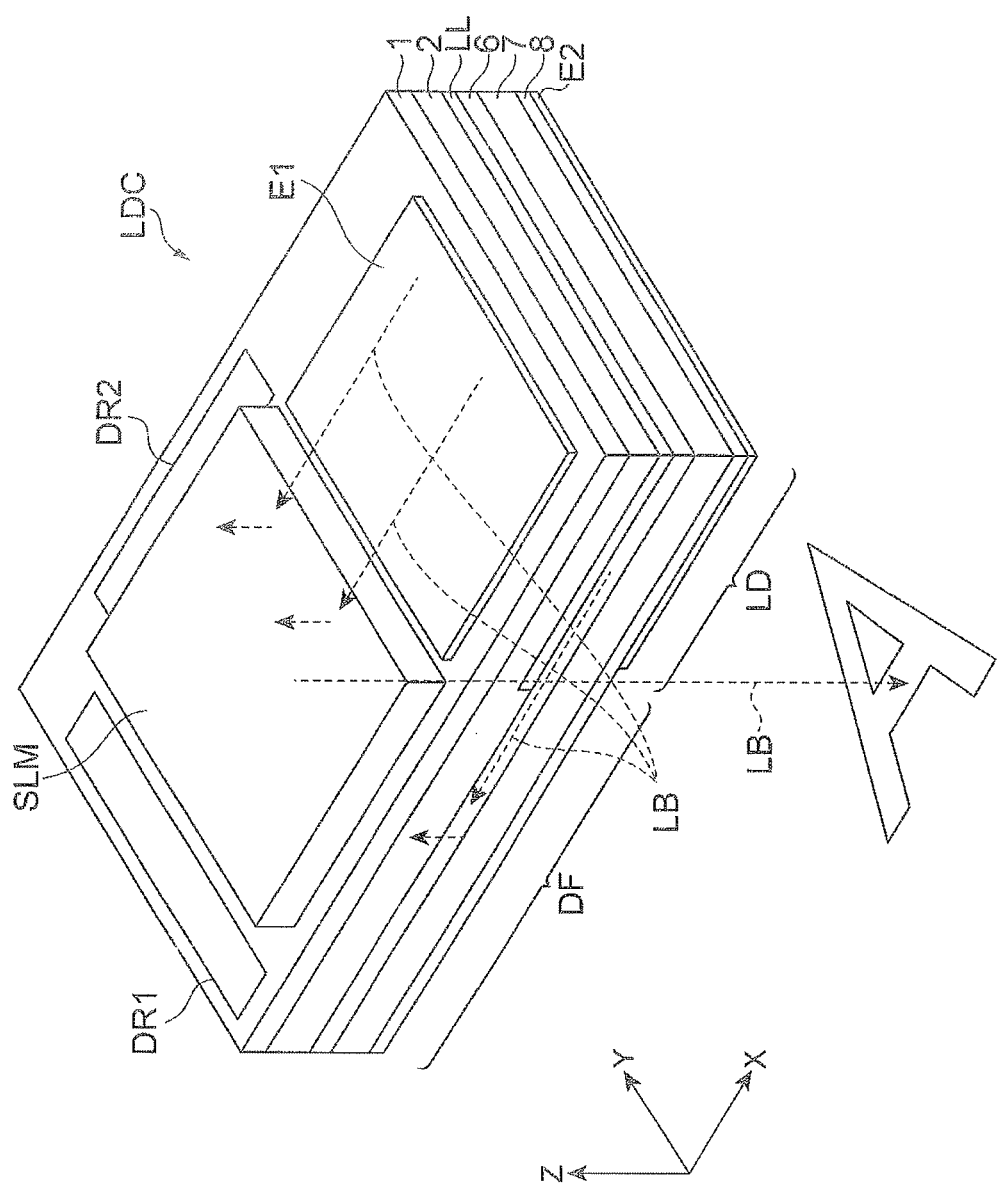
FIG. 1 is a perspective view of a semiconductor laser device.

FIG. 1 is a perspective view of a semiconductor laser device,

The semiconductor laser device includes a semiconductor laser chip LDC, which includes a compound semiconductor, and a spatial light modulator SLM optically combined with the semiconductor laser chip LDC.

The semiconductor laser chip LDC includes an emission layer LL including an active layer, a pair of cladding layers 2 and 7 sandwiching the emission layer LL, and a diffraction grating layer 6 optically-combined with the emission layer LL. Note that the emission layer LL includes an active layer and optical guide layers to sandwich the active layer, when necessary. The semiconductor laser chip LDC includes a semiconductor substrate 1. It is assumed that a thickness direction of the semiconductor substrate 1 is a Z-axis and two directions vertical thereto are respectively an X-axis and a Y-axis.

It is assumed that semiconductor layers are serially and epitaxially grown on a surface in a −Z-axis direction of the semiconductor substrate 1. In this case, when it is assumed that the −Z-axis direction is an upward direction, the lower cladding layer 2, the emission layer LL, the diffraction grating layer 6, the upper cladding layer 7, and a contact layer 8 are serially formed on the semiconductor substrate 1. On a surface on a +Z-axis side of the semiconductor substrate 1, an electrode E1 is formed and on a surface on a −Z-axis side of the contact layer 8, an electrode E2 is formed.

Here, the emission layer LL and the electrodes E1 and E2 are formed only in a laser beam generation region LD and are not formed in a deflection region DF. When current is supplied from a driving circuit to the electrodes E1 and E2, the emission layer LL emits light. That is when a driving current is supplied between the first electrode E1 and the second electrode E2, a recombination of an electron and a hole is caused in an active layer 4 and the active layer 4 emits light. A carrier which contributes to the emission of light and the generated light are efficiently kept between upper/lower optical guide layers 3 and 5 and the cladding layers 2 and 7 (see FIG. 3 to FIG. 6, FIG. 9, and FIG. 10).

A laser beam LB generated in the emission layer LL propagates in the diffraction grating layer 6, moves in a −X-axis direction, and reaches the deflection region DF. In the deflection region DF, the diffraction grating layer 6 deflects the laser beam in a direction orthogonal to the thickness direction, that is, in the Z-axis direction. The deflected laser beam moves in the +Z-axis direction and enters the spatial light modulator SLM through the cladding layer 2 and the semiconductor substrate 1.

The spatial light modulator SLM is attached to the deflection region DF of the semiconductor laser chip LDC in such a manner that the laser beam LB which is output in the thickness direction of the diffraction grating layer 6 is input. The laser beam enters a liquid crystal layer LC through a transparent one of a common electrode 25 and a pixel electrode 21 of the spatial light modulator SLM (see FIG. 3), The spatial light modulator SLM modulates a phase of the laser beam LB in each minute region with a driving voltage applied between the pixel electrode and the common electrode, reflects a laser beam a phase of which is modulated, and outputs the beam to the outside through a semiconductor laser chip.

The laser beam LB output from the spatial light modulator SLM is superimposed in a state, in which a phase in each minute region is adjusted, and forms various laser beam patterns. In the same drawing, a far-field image of the superimposed laser beam LB forms a character "A."

The semiconductor laser device further includes a selection circuit (row selection circuit DR1 and column selection circuit DR2) which is arranged on the semiconductor laser chip LDC and which selectively gives a driving voltage between a pixel electrode and a common electrode placed at intended addresses. By providing this selection circuit on the semiconductor laser chip, it is possible to control the spatial light modulator without providing a large-scale external wiring group.

Figure 2:
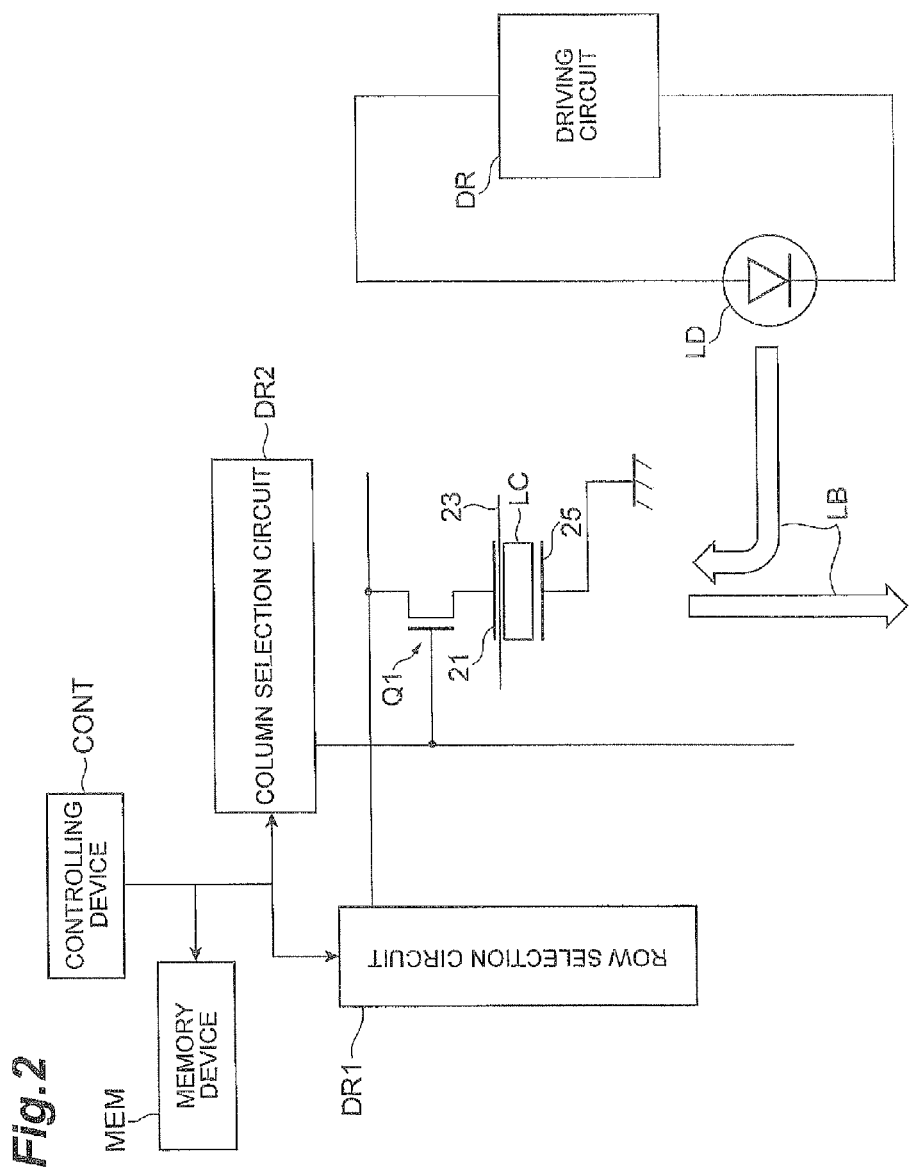
FIG. 2 is a circuit diagram of the semiconductor laser device.

FIG. 2 is a circuit diagram of the semiconductor laser device.

The spatial light modulator SLM includes a transparent common electrode 25, a plurality of transparent pixel electrodes 21, a liquid crystal layer LC arranged between the common electrode 25 and the pixel electrodes 21. The liquid crystal layer LC includes a nematic liquid crystal, a ferroelectric liquid crystal, or the like. From a driving circuit DR, a driving current is supplied to a laser beam generation region LD included in a semiconductor laser element. Accordingly, the laser beam LB is output from the emission layer LL. The laser beam LB reaches the liquid crystal layer LC through the pixel electrode 21 of the spatial light modulator. Then, after phase modulation in the liquid crystal layer LC, the laser beam LB is reflected by a reflection mirror or a reflection film 23 and is output to the outside through the common electrode 25. The common electrode 25 is connected to fixed potential (ground) and the pixel electrode 21 is connected to the row selection circuit DR1 through a switching element Q1 and a row line. A column line is extended from the column selection circuit DR2 and is connected to a control terminal of a switching element Q1. The switching element Q1 is a field-effect transistor. In this case, the control terminal is a gate of a transistor.

In the spatial light modulator, when a particular address (x, y) is specified, an ON signal is output from the column selection circuit DR2 to a column line of a coordinate x and intended potential is supplied from the row selection circuit DR1 to a row line of a coordinate y. In this case, a driving voltage is applied between the pixel electrode 21 at the address (x, y) and the common electrode 25 and a refractive index in the liquid crystal layer varies. Thus, an optical path length varies and a phase of a laser beam is adjusted. Note that in the spatial light modulator, a row direction and a column direction are determined subjectively and are mutually replaceable directions. An amount of the driving voltage is determined depending on output potential from the row selection circuit DR1 and output potential from the column selection circuit DR2 and can be constant. However, in a case of performing more precise phase control, for example, a variable resistance is connected to each switching element Q1 and a value of the variable resistance is controlled by a selection circuit with a similar configuration.

Note that in order to make a device output an intended pattern even when there is an in-plane variation in a phase of the spatial light modulator during production, a storage device to previously measure a phase distribution of the spatial light modulator and to correct this and a driving circuit for a spatial light modulator which circuit generates a driving voltage supplied to each pixel electrode through a selection circuit based on storage data in the storage device may be provided. That is, the semiconductor laser device can include a storage device to previously measure a phase distribution of the spatial light modulator, to store a correction value of an initial phase which value is for correction of an in-plane variation in a phase based on a measurement value, and to give a different initial phase to each pixel electrode of the spatial light modulator. In other words, the device includes a memory device MEM which stores an initial correction value of a driving voltage in each pixel electrode. The driving voltage is applied from a controlling device CONT each of the selection circuits DR1 and DR2. The driving voltage and the initial correction value are stored in the memory device MEM. It is possible to compare a basic phase distribution with a measured phase distribution and to set, as an initial correction value, a value of a driving voltage corresponding to a difference in a phase of each pixel. When a driving voltage of the initial correction value is supplied to the pixel electrode, the basic phase distribution is realized. In order to acquire an intended phase distribution, it is possible to superimpose an intended driving voltage on the driving voltage corresponding to the initial correction value.

Figure 3:
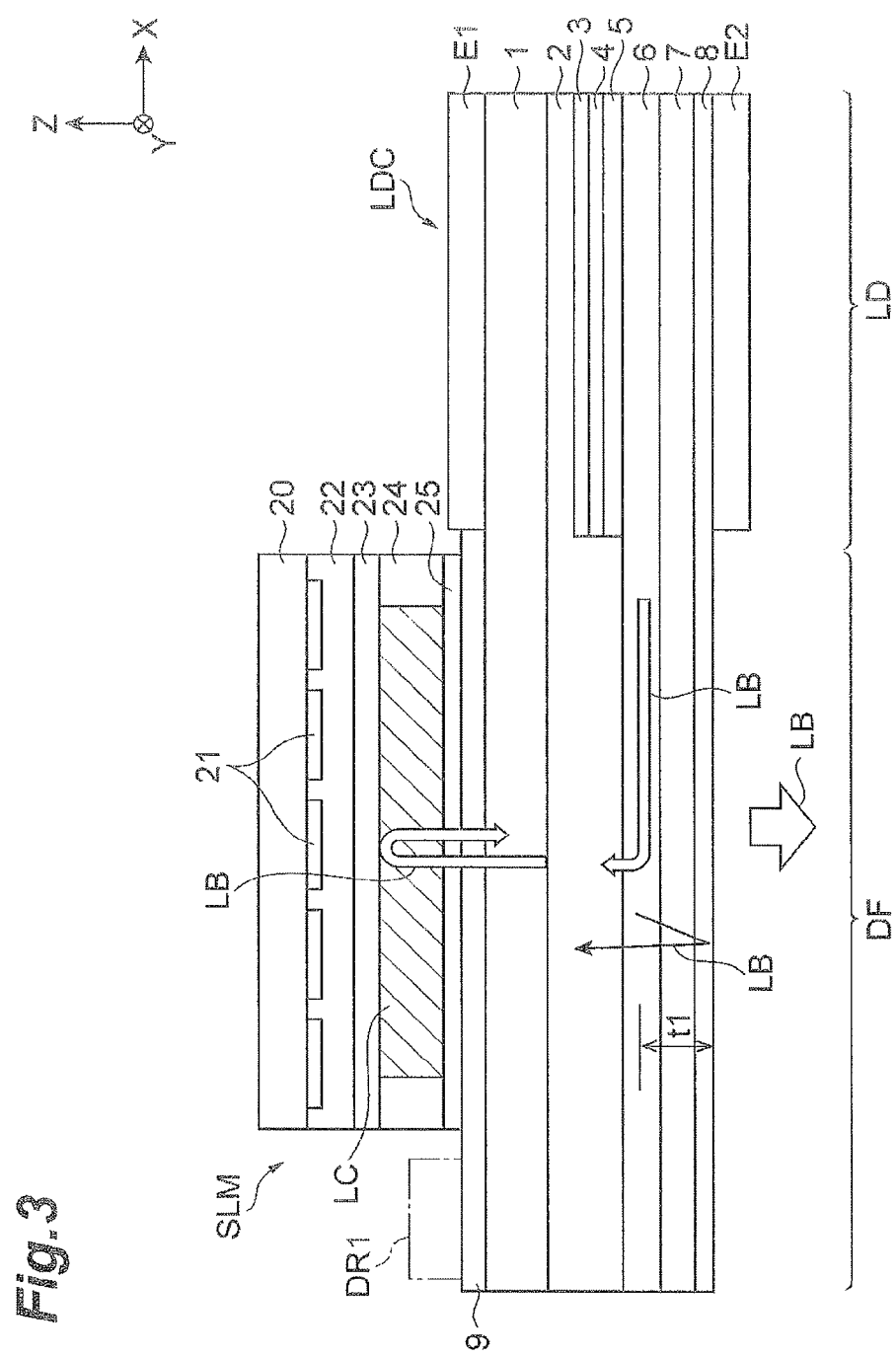
FIG. 3 is a vertical sectional view of a semiconductor laser device according to a first embodiment.

FIG. 3 is a vertical sectional view of a semiconductor laser device according to a first embodiment.

A laser beam output in the thickness direction from the diffraction grating layer 6 reaches the liquid crystal layer LC through the common electrode 25 (or pixel electrode 21 when position is switched with pixel electrode). A permittivity (refractive index) of the liquid crystal layer LC varies depending on voltage applied to the pixel electrode 21. Thus, an optical path length of the liquid crystal layer LC with respect to a laser beam varies and a phase varies. A phase of the laser beam LB which is transmitted through the liquid crystal layer LC and which reciprocates therein is modulated with respect to each pixel electrode 21. Thus, it is possible to perform wave front control of each minute region and to form an intended variable laser beam pattern by superimposition of wave fronts.

Note that a transparent insulation film 9 including $SiO_2$ or $SiN_x$ is formed on the deflection region DF. The common electrode 25 of the spatial light modulator SLM is arranged on the transparent insulation film 9. On the common electrode 25, a frame spacer 24 to keep liquid crystal is provided and a space in the spacer 24 is filled with the liquid crystal layer LC. A reflection film 23 is formed on the spacer 24 and the liquid crystal layer LC. On the reflection film 23, the plurality of pixel electrodes 21 is provided via a protection film 22. The pixel electrodes 21 are placed between a substrate 20 and the protection film 22. In forming of the pixel electrodes 21 or the like, after the pixel electrodes 21 are formed on the substrate 20 which preferably includes a semiconductor, the pixel electrodes 21 are covered by the protection film 22 in such a manner that surfaces thereof become smooth. Then, the reflection film 23 is formed on the protection film 22 and a substrate of this intermediary body is inverted and arranged on a frame spacer 24. Note that an arbitrary alignment film is provided on each of upper and lower surfaces of the liquid crystal layer LC.

The laser beam LB reflected on the reflection film 23 on the liquid crystal layer LC is output to the outside through the common electrode 25 and the semiconductor laser chip LDC. Also, a distance t1 between (central position in thickness direction of) the diffraction grating layer 6 and the contact layer 8 is set in such a manner that the laser beam LB reflected on an exposed surface of the contact layer 8 in the semiconductor laser chip and light which directly moves from the diffraction grating layer 6 to the spatial light modulator SLM are increased. That is, the distance t1 can satisfy the following relation. $2 \times t1 = \lambda \times N$ or $2 \times t1 = \lambda \times (N+\frac{1}{2})$. However, $\lambda$ is set to satisfy a wavelength of a laser beam and N is set to satisfy an integer number.

The emission layer LL illustrated in FIG. 1 includes the active layer 4 and the optical guide layers 3 and 5 sandwiching this, these layers being formed only in the laser beam generation region. Also, the contact layer 8 is provided when necessary.

The semiconductor laser chip includes the laser beam generation region LD in which the active layer 4 is formed, and a deflection region DF which is adjacent to and the laser beam generation region LD and which deflects a laser beam. The diffraction grating layer 6 is extended in such a manner as to be placed in both of the laser beam generation region LD and the deflection region DF. The diffraction grating layer 6 deflects a laser beam in the thickness direction of the diffraction grating layer 6. The spatial light modulator SLM is attached to the deflection region DF. In a case of the first embodiment, by separately providing the laser beam generation region LD and the deflection region DF, it is possible to optimize a characteristic in each region.

Figure 4:
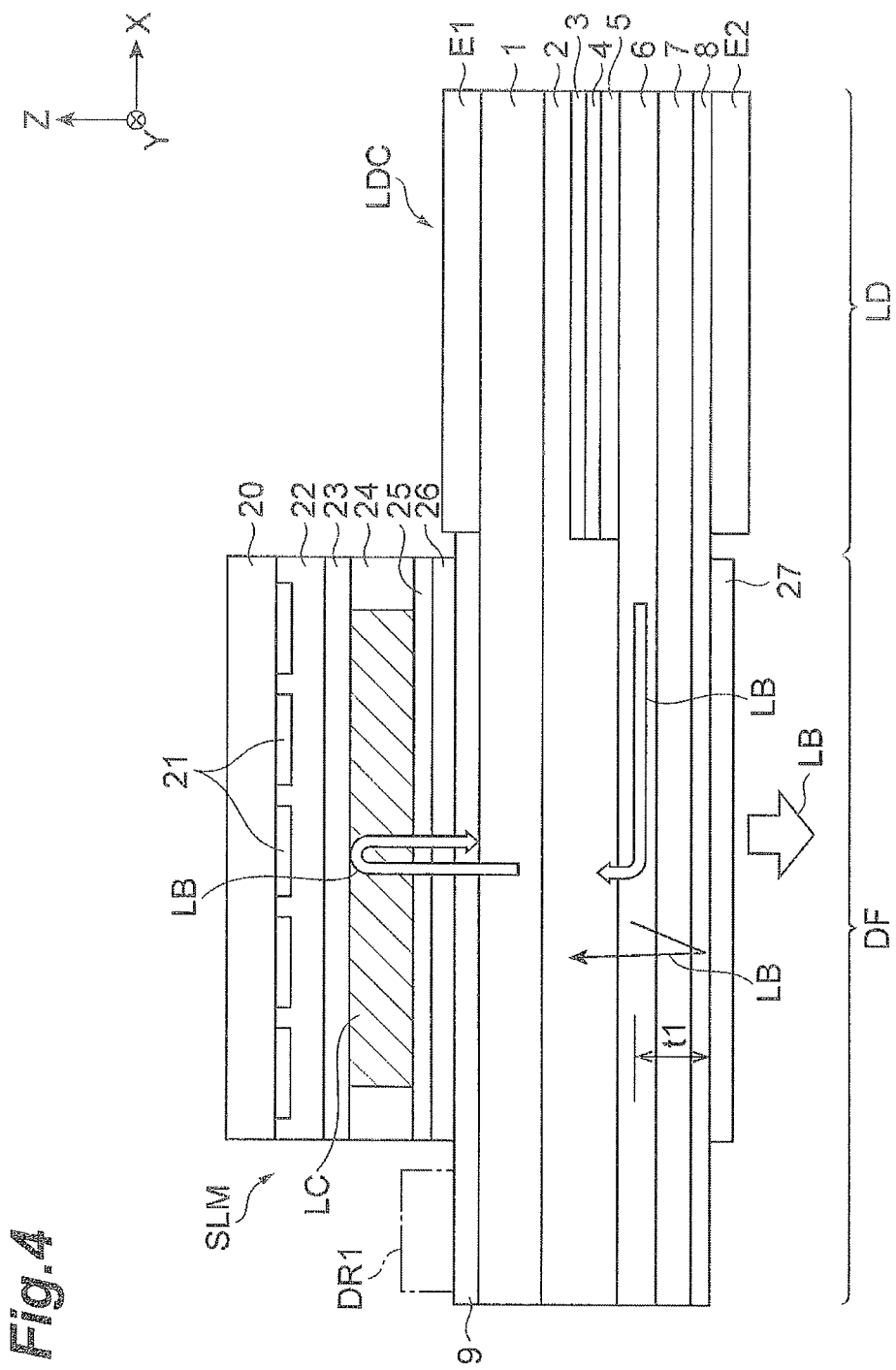
FIG. 4 is a vertical sectional view of a semiconductor laser device according to a second embodiment.

FIG. 4 is a vertical sectional view of a semiconductor laser device according to a second embodiment.

The second embodiment is different from the first embodiment in a point that a quarter wave plate ($\lambda/4$ retardation film) and a polarizer are thither included and the other points are identical thereto. That is, this device further includes a quarter wave plate 26 arranged between a semiconductor laser chip LDC and a spatial light modulator SLM, and a polarizer 27 provided on a surface of the semiconductor laser chip LDC which surface is on an opposite side of the spatial light modulator SLM.

For example, the diffraction grating layer 6 has a structure, in which triangular shapes are arrayed in a square lattice manner, and diffracts linearly-polarized light in an upward/downward direction. When it is assumed that a polarization transmission axis of the linearly-polarized light output from the diffraction grating layer 6 is an axis A, a polarization transmission axis of the polarizer 27 is set in a direction orthogonal to the axis A (which direction is assumed as axis B). Also, a fast axis of the quarter wave plate is set in a direction rotated for 45° from the axis A. A polarization orientation of a laser beam which enters the spatial light modulator SLM trough the quarter wave plate 26, reciprocates in the spatial light modulator SLM, and passes through the quarter wave plate 26 again in an opposite direction is rotated for 90°. That is, when a laser beam LB enters the quarter wave plate 26 as linearly-polarized light in a first polarization direction (axis A) and passes through the quarter wave plate twice, the beam becomes linearly-polarized light in a second polarization direction (axis B) rotated for 90° in the first polarization direction.

Thus, when a polarization direction in the polarizer 27 is made identical to the second polarization direction (axis B), only a laser beam which reciprocates in the spatial light modulator SLM passes through the polarizer 27 and a component in the other polarization direction is cut by the polarizer 27. Thus, a noise component which is not modulated by the liquid crystal layer LC is eliminated from an output image and contrast is improved. Note that positions of a common electrode 25 and the quarter wave plate 26 can be switched.

Figure 5:
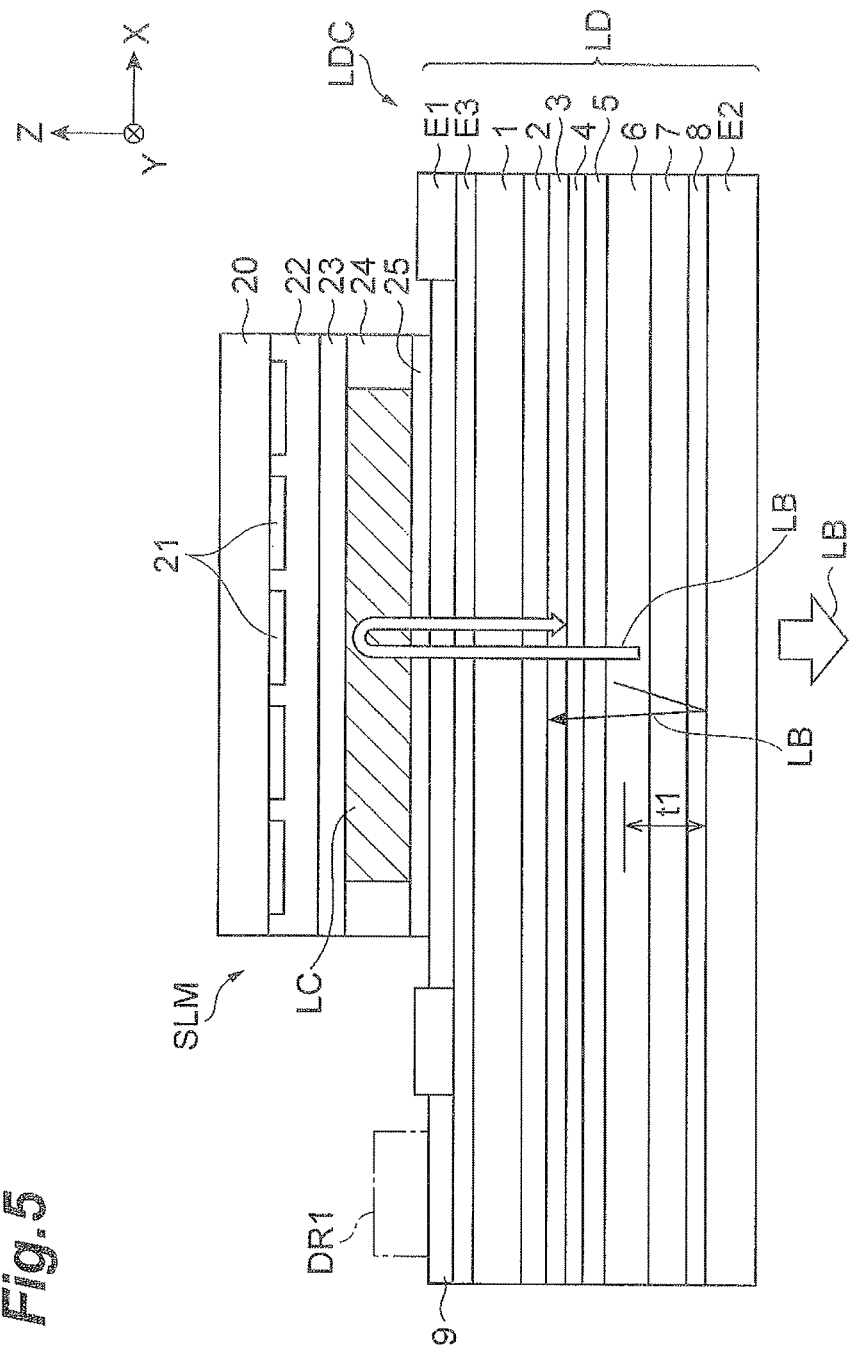
FIG. 5 is a vertical sectional view of a semiconductor laser device according to a third embodiment.

FIG. 5 is a vertical sectional view of a semiconductor laser device according to a third embodiment.

A position of a spatial light modulator SLM and an electrode structure of a laser in the third embodiment are changed from those in the first embodiment and the other configurations are identical thereto.

The semiconductor laser chip includes a laser beam generation region LD in which an active layer 4 is formed. A diffraction grating layer 6 is placed in a laser beam generation region LD and emits a laser beam LB in a thickness direction of the diffraction grating layer 6. The spatial light modulator SLM is attached to the laser beam generation region LD. In this case, it is possible to downsize a device by arranging the spatial light modulator SLM in the laser beam generation region LD.

Note that on a surface on a +Z side of a semiconductor substrate 1, a transparent electrode or a semiconductor region with high impurity density (conductive region E3) is formed and a transparent insulation film 9 is formed thereon. An electrode E1 is electrically and physically connected to the conductive region E3 and has an opened shape. The spatial light modulator SLM is provided inside of the opened shape of the electrode E1. In this case, a row selection circuit DR1 and a column selection circuit DR2 are placed outside of the electrode E1. Thus, a connection wiring line is provided from each of these to a pixel electrode and a common electrode. Also, in the third embodiment, an electrode E2 transmits a part or the whole of the laser beam LB. More specifically, the electrode E2 has a configuration which is, for example, a transparent electrode such as ITO, ZnO, graphene, or an Ag nanowire or a mesh structure having metal such as Au or Ag and having a microscopic opening. Here, the mesh structure is not necessarily periodic.

Figure 6:
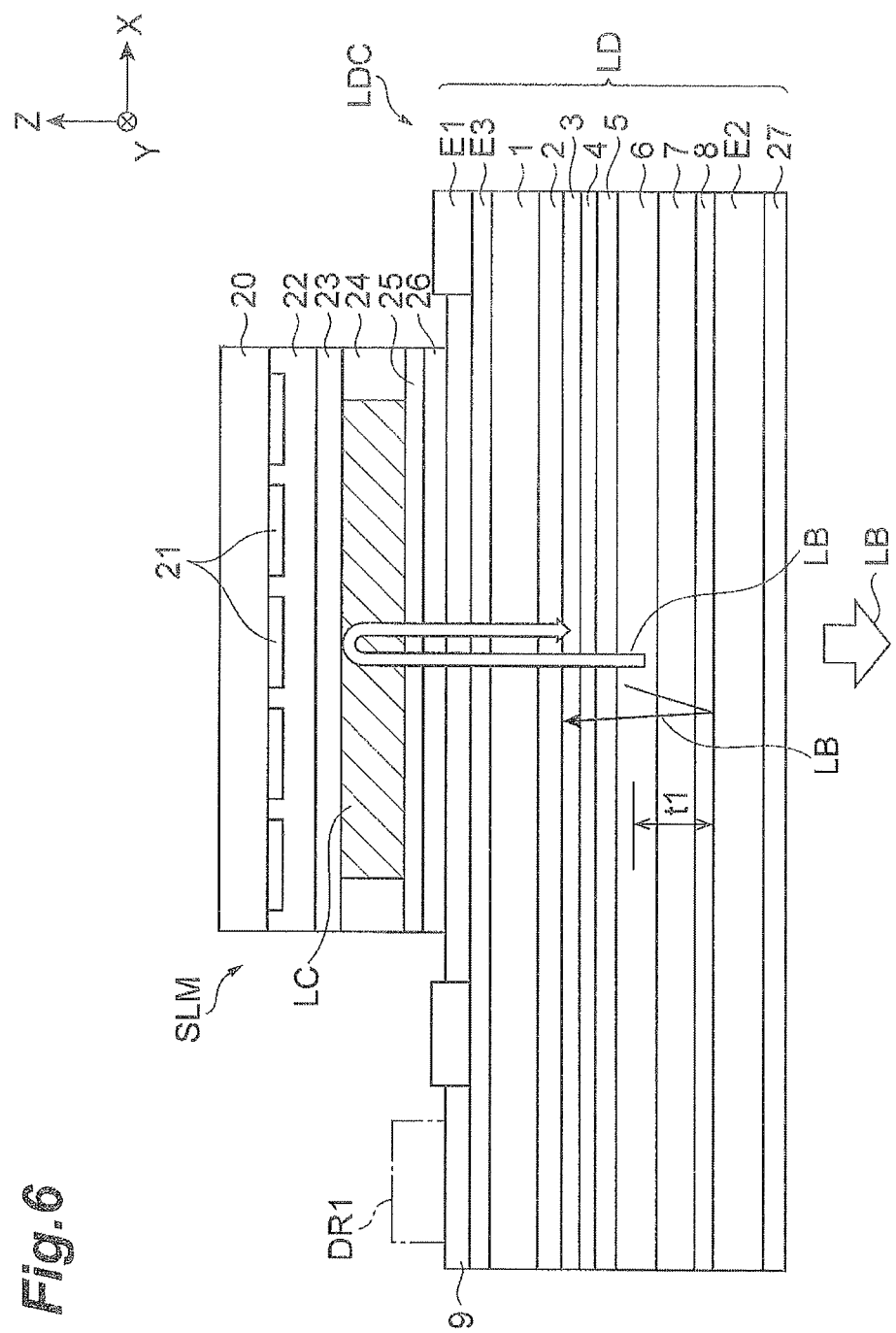
FIG. 6 is a vertical sectional view of a semiconductor laser device according to a fourth embodiment.

FIG. 6 is a vertical sectional view of a semiconductor laser device according to a fourth embodiment.

A position of a spatial light modulator SLM and an electrode structure of a laser in the fourth embodiment are changed from those in the second embodiment and the other configurations are identical thereto.

The semiconductor laser chip includes a laser beam generation region LD in which an active layer 4 is formed. A diffraction grating layer 6 is placed in a laser beam generation region LD and emits a laser beam LB in a thickness direction of the diffraction grating layer 6. The spatial light modulator SLM is attached to the laser beam generation region LD. In this case, it is possible to downsize a device by arranging the spatial light modulator SLM in the laser beam generation region LD.

Note that on a surface on a +Z side of a semiconductor substrate 1, a transparent electrode or a semiconductor region with high impurity density (conductive region E3) is formed and a transparent insulation film 9 is formed thereon. An electrode E1 is electrically and physically connected to the conductive region E3 and has an opened shape. The spatial light modulator SLM is provided inside of the opened shape of the electrode E1. In this case, a row selection circuit DR1 and a column selection circuit DR2 are placed outside of the electrode E1. Thus, a connection wiring line is provided from each of these to a pixel electrode and a common electrode.

Figure 7:
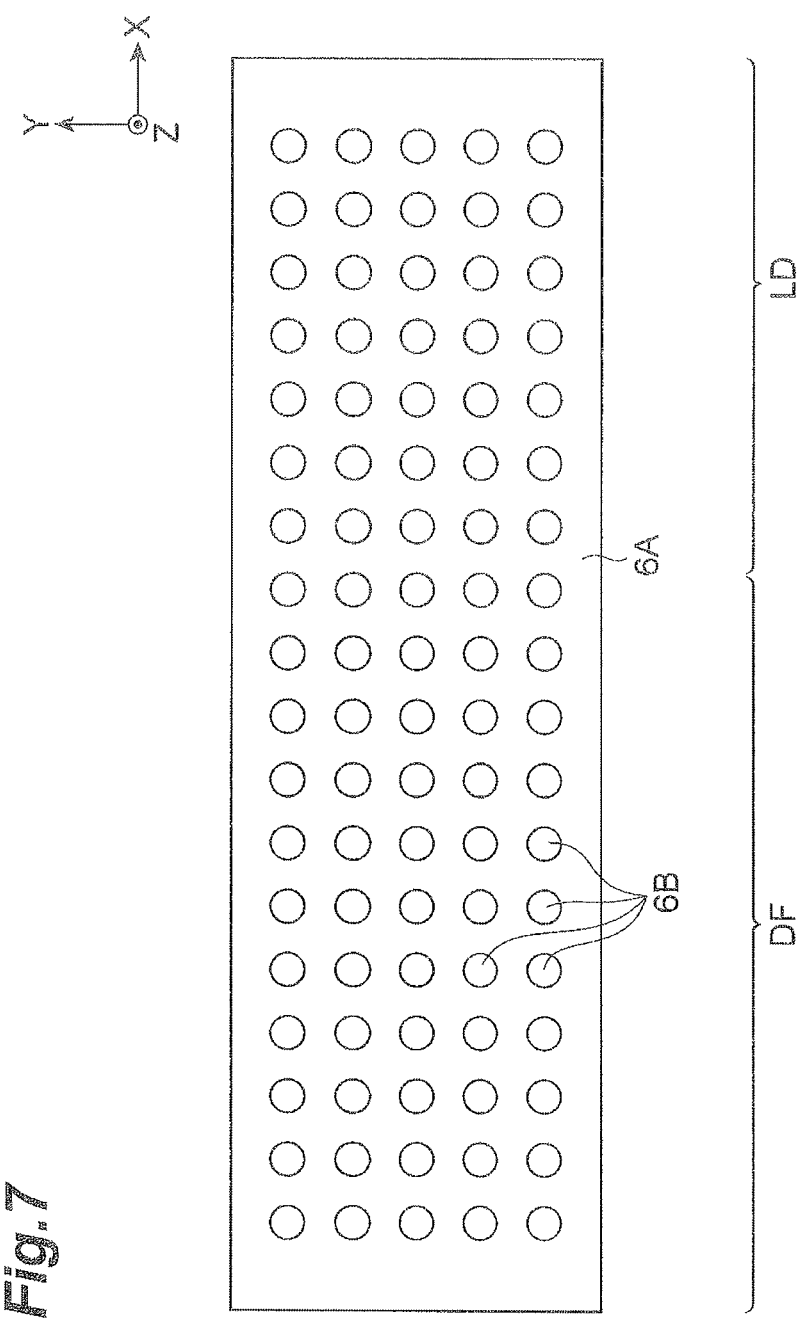
FIG. 7 is a plan view of a diffraction grating layer.

FIG. 7 is a plan view of a diffraction grating layer.

The above-described diffraction grating layer 6 includes, for example, a basic layer 6A and a different-refractive-index region 6B. The different-refractive-index region 6B is embedded into the basic layer 6A for a predetermined depth and has a refractive index different therefrom. A planar shape of the different-refractive-index region 6B is illustrated as a circle but may be a different shape such as a triangle or an oval. For example, in order to increase intensity in a specific polarization direction, a shape may be a shape without revolution symmetry through 90°. In order to acquire linearly-polarized light, the shape can be, for example, an isosceles triangle, a right triangle, or an isosceles right triangle. The different-refractive-index region 6B is arranged at a lattice position of a square lattice but may be arranged at a lattice position of a triangle lattice. Due to embedment of a different-refractive-index region, the diffraction grating layer 6 has a periodic structure in which a refractive index is two-dimensionally varied. Thus, the diffraction grating layer 6 functions as a photonic crystal layer as well as a diffracting grating.

The periodic structure in the laser beam generation region LD and the periodic structure in the deflection region DF are illustrated as being identical to each other but may have different shapes. For example, a periodic structure in which true-circular through-holes are arrayed in a square lattice manner may be used in the laser beam generation region LD and a periodic structure in which triangular through-holes are arrayed in a square lattice manner may be used in the deflection region DF. Here, while beams diffracted in upward and downward directions cancel each other in the laser beam generation region LD due to a symmetric property, beams diffracted in upward and downward directions do not cancel each other completely and are output in the deflection region DF. Thus, an unnecessary output from the laser beam generation region is not performed and improvement in efficiency is expected.

The above-described semiconductor laser element is a surface-emission laser, a part thereof being pulled out in a horizontal direction (FIG. 3 and FIG. 4) or being pulled out in a thickness direction (FIG. 5 and FIG. 6) and being input into the spatial light modulator SLM. When the semiconductor laser element is an end surface-emission laser, the following structure can be considered.

Figure 8:
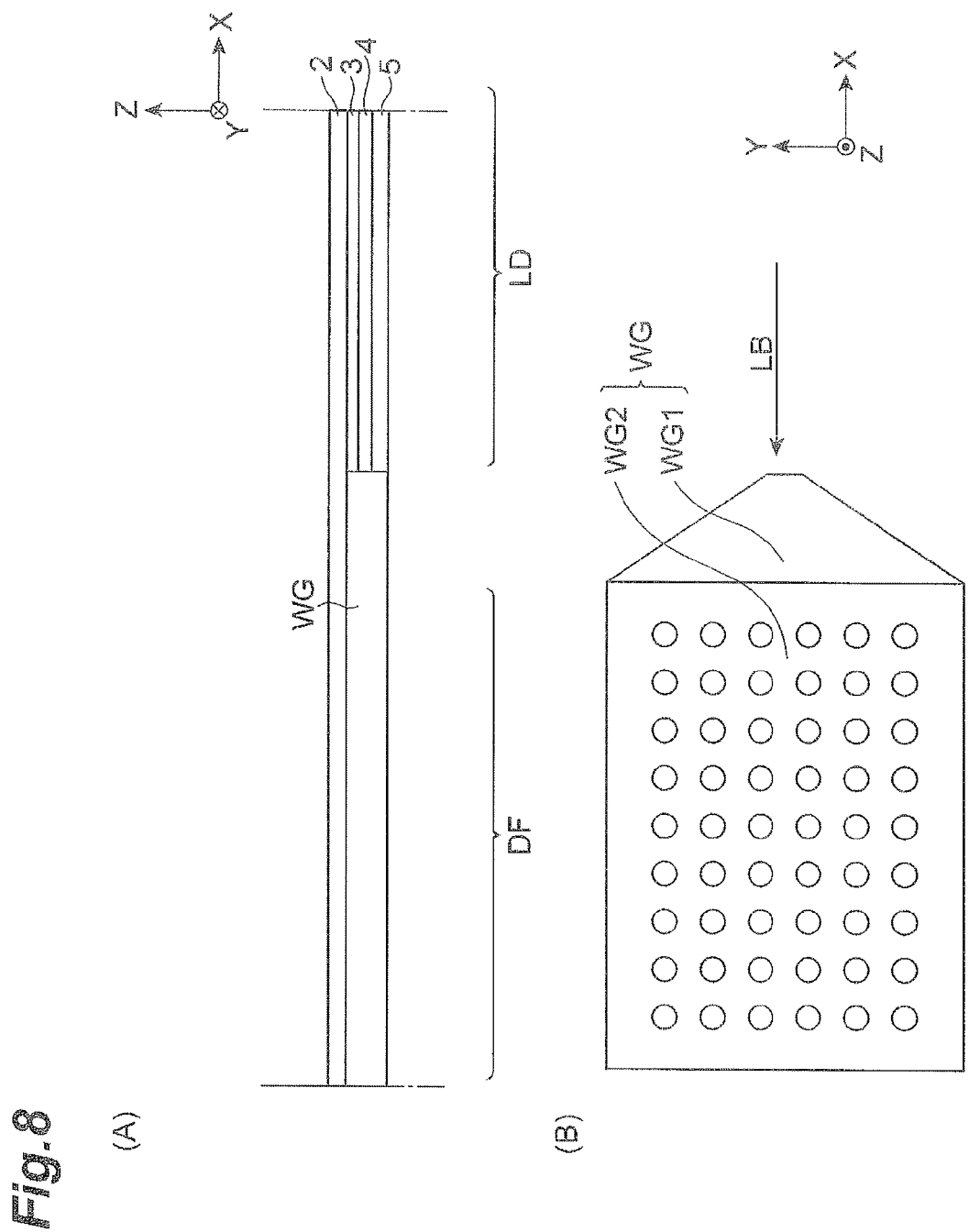
FIG. 8-(A) is a vertical sectional view of a part of a semiconductor laser device including a tapered waveguide and FIG. 8-(B) is a plan view of a waveguide WG.

FIG. 8-(A) is a vertical sectional view of a part of a semiconductor laser device including a tapered waveguide and FIG. 8-(B) is a plan view of a waveguide WG. A part which is not illustrated is identical to the structure in FIG. 3 or FIG. 4 and a diffraction grating layer 6 can be omitted. A laser beam LB output in a horizontal direction from the active layer 4 is input into a waveguide WG adjacent thereto. The waveguide WG includes a tapered waveguide WG1 and a waveguide (diffusion part) WG2 having a rectangular planar shape. A width in a Y-axis direction of the laser beam is increased by the tapered waveguide WG1 and a laser beam in a wide range is deflected in a thickness direction (Z-axis direction) of a substrate by the diffusion part WG2. In the diffusion part WG2, a diffracting grating identical to that illustrated in FIG. 7 is formed and the diffusion part WG2 functions as a diffraction grating layer. Similarly to the above, the deflected laser beam enters a spatial light modulator SLM. Note that the diffusion part WG2 of the waveguide WG is optically connected to an active layer.

As described above, each of the semiconductor laser devices is a semiconductor laser device including a semiconductor laser chip and a spatial light modulator optically connected to the semiconductor laser chip. The semiconductor laser chip includes an active layer, a pair of cladding layers sandwiching the active layer, and a diffraction grating layer optically coupled to the active layer. The spatial light modulator includes a common electrode, a plurality of pixel electrodes, a liquid crystal layer arranged between the common electrode and the pixel electrodes. The spatial light modulator is attached to the semiconductor laser chip in such a manner that a laser beam output in a thickness direction of the diffraction grating layer is input through a transparent one of the common electrode and the pixel electrodes. A phase of the laser beam in each minute region is modulated by a driving voltage applied between the pixel electrodes and the common electrode and the laser beam a phase of which is modulated is reflected and output to the outside.

Note that a material of the above-described laser element will be described.

As an example of a material of a semiconductor laser element included in the laser beam generation region LD, a semiconductor substrate 1 has GaAs, a lower cladding layer 2 has AlGaAs, a lower optical guide layer 3 has AlGaAs, an active layer 4 has a multi-quantum well structure MQW (barrier layer: AlGaAs/well layer: InGaAs), an upper optical guide layer 5 has lower-layer AlGaAs/upper-layer GaAs, an upper cladding layer 7 has AlGaAs, and a contact layer 8 has GaAs, In a diffraction grating layer (phase modulation layer and refractive index modulation layer) 6, a basic layer 6A has GaAs and a different-refractive-index region (embedded layer) 6B embedded in the basic layer 6A has AlGaAs.

Note that to each layer, a first conductive type (N-type) impurity or second conductive-type (P-type) impurity is added (impurity density is $1\times10^{17}$ to $1\times10^{21}/cm^{3}$). The semiconductor substrate 1 can be the N-type, the lower cladding layer 2 can be the N-type, the lower optical guide layer 3 can be an I-type, the active layer 4 can be the I-type, the lower layer of the upper optical guide layer 5 can be the P-type or the I-type P and the upper layer thereof can be the I-type, the diffraction grating layer 6 can be the I-type, the upper cladding layer 7 can be the P-type, and the contact layer 8 can be the P-type. Note that a region to which no impurity is intentionally added is intrinsic (I-type). An impurity density of the I-type is $1\times10^{16}/cm^{3}$ or lower.

Also, for example, a thickness of the semiconductor substrate 1 can be 150 μm (80 μm to 350 μm), a thickness of the lower cladding layer 2 can be $2\times10^{3}$ nm ($1\times10^{3}$ nm to $3\times10^{3}$ nm), a thickness of the lower optical guide layer 3 can be 150 nm (0 to 300 nm), a thickness of the active layer 4 can be 30 nm (10 nm to 100 nm, a thickness of the lower layer of the upper optical guide layer 5 can be 50 nm (10 nm to 100 nm) and a thickness of the upper layer thereof can be 50 nm (10 nm to 200 nm), a thickness of the diffraction grating layer 6 can be 100 nm (50 nm to 200 nm), a thickness of the upper cladding layer 7 can be $2\times10^{3}$ nm ($1\times10^{3}$ nm to $3\times10^{3}$ nm), and a thickness of the contact layer 8 can be 200 nm (50 nm to 500 nm). Note that values in parentheses are preferable values.

Also, setting is performed in such a manner that an energy band gap in the cladding layer is larger than an energy band gap in the optical guide layer and the energy band gap in the optical guide layer is larger than an energy band gap in the well layer of the active layer 4. In AlGaAs, it is possible to easily change an energy band gap and a refractive index by changing a composition ratio of Al. In $Al_XGa_{1-X}As$, when a composition ratio X of Al with a relatively-small atomic radius is decreased (increased), an energy band gap positively correlated therewith becomes smaller (larger). Also, when In with a large atomic radius is mixed into GaAs and InGaAs is formed, an energy band gap becomes smaller. That is, the Al composition ratio in the cladding layer is larger than the Al composition ratio in the optical guide layer and the Al composition ratio in the optical guide layer is equivalent to or larger than that of the barrier layer (AlGaAs) in the active layer. The Al composition ratio of the cladding layer is set as 0.2 to 0.4, and is set as 0.3 in the present example. The Al composition ratio of the barrier layer in each of the optical guide layer and the active layer is set as 0.1 to 0.15, and is set as 0.1 in the present example. Note that a layer which is around 10 to 100 nm and which has an Al composition equivalent to that of the cladding layer may be provided between the guide layer and the second conductive type (p-type) cladding layer in order to control a leak of an electron from the active layer.

Note that a pillar different-refractive-index region in the diffraction grating layer 6 may be formed as a void and may be filled with a gas such as air, nitrogen, or argon. Also, in the diffraction grating layer 6, the different-refractive-index region 6B is arranged at a lattice position in a square lattice or a triangle lattice on an XY plane. A distance between vertical and horizontal lattice lines in the square lattice is a value around a wavelength of a laser beam, which is divided by an equivalent refractive index, and is preferably set around 300 nm. The different-refractive-index region may be arranged not at the lattice position in the square lattice but at the lattice position in the triangle lattice. A distance between horizontal and slanted lattice lines in a case of the triangle lattice is a value around a wavelength, which is divided by an equivalent refractive index and is further divided by Sin 60°, and is preferably set around 350 nm.

Note that in a case of a square lattice with a lattice distance a, when unit vectors in orthogonal coordinates are x and y, primitive translation vectors are $a_1=ax$ and $a_2=ay$ and primitive reciprocal lattice vectors are $b_1=(2\pi/a)y$ and $b_2=(2\pi/a)x$ with respect to the primitive translation vectors $a_1$ and $a_2$. In a case of a point Γ in a photonic band of photonic crystal, that is, a case of a wave vector $k=nb_1+mb_2$ (n and m are arbitrary integer number), a resonance mode in which the lattice distance a is equal to a wavelength λ (standing wave on XY plane) is acquired.

When being transparent, the common electrode and the pixel electrode have ITO or ZnO. Such a material is transparent with respect to a laser beam and a laser beam can pass therethrough.

Also, the above-described reflection film 23 includes a single-layer or multi-layer mirror made from metal such as aluminum. In the multi-layer mirror, a layer with a high refractive index material (=nH) and a layer with a low refractive index material (=nL) which layer has a relatively lower refractive index are laminated alternately. A material of the layer with a high refractive index material (nH) includes at least one material (such as $Ta_2O_5$) selected from an oxide material group (insulator group) such as $Ta_2O_5$, $TiO_2$, $Nb_2O_5$, and $HfO_2$. A material of the layer with a low refractive index material (nL) includes at least one material (such as $SiO_2$) selected from an insulator material group such as $SiO_2$ and $MgF_2$. A thickness of an optical film of each of the layer with a high refractive material (nH) and a layer with a low refractive index material (nL) is set as ¼ of the wavelength λ of the laser beam. As laminate structures of these dielectric layers, the following kinds are considered.

(1): A first structure is a structure in which a pair (=A) of the layer with a low refractive index material (nL) and the layer with a high refractive material (nH) is repeatedly laminated for m times, the number of all layers in this case being 2×A×m. Here, m is a natural number. Note that the lowest layer is the layer with a low refractive index material (nL). (2): A second structure is a structure in which the layer with a low refractive index material (nL) is further laminated on the layer with a high refractive material (nH) which is an outermost surface after the above-described pair (A) is repeatedly laminated for m times, the number of all layers hi this case being 2×A×m+1. (3): A structure in which a position of the layer with a high refractive index material (nH) and a position of a layer with a low refractive material (nL) are switched in the structure in (1) or (2) can be also employed. In a case of the structure in (3), the lowest layer is the layer with a high refractive index material (nH).

Finally, the above-described semiconductor laser element will be described briefly.

In production of a semiconductor laser element, a metal organic chemical vapor deposition (MOCVD) method is used with respect to each compound semiconductor layer. Crystal growth is performed on a (001) surface of the semiconductor substrate 1. However, this is not the limitation. In production of a laser element using AlGaAs, a growth temperature of AlGaAs is 500° C. to 850° C. In an experiment, 550 to 700° C. are employed. Trimethylaluminum (TMA) is used as an Al material in the growth, trimethylgallium (TMG) and triethylgallium (TEG) are used as gallium materials, arsine ($AsH_3$) is used as an As material, disilane ($Si_2H_6$) is used as a material for a N-type impurity, and diethyl zinc (DEZn) is used as a material for a P-type impurity. In a case of growing AlGaAs, TMA, TMG and arsine are used. In a case of growing GaAs, TMG and arsine are used but TMA is not used. InGaAs is produced by using TMG, trimethylindium (TMI), and arsine. An insulation film is formed from a material of a configuration substance and by spattering of a target.

That is, with respect to the semiconductor laser element illustrated in FIG. 3, first, the N-type cladding layer (AlGaAs) 2 is formed on the N-type semiconductor substrate (GaAs) 1. Then, a part of the cladding layer 2 is etched and the optical guide layer (AlGaAs) 3, the multi-quantum well structure (InGaAs/AlGaAs) 4, and the optical guide layer (GaAs/AaGaAs) 5 are formed on the etched region. Subsequently, the basic layer (GaAs) 6A to be a photonic crystal layer is epitaxially grown by using the metal organic chemical vapor deposition (MOCVD) method.

Then, for alignment after the epitaxial growth, a SiN layer is formed on the basic layer 6A by a plasma CVD (PCVD) method and a resist is formed on the SiN layer. Also, the resist is exposed and developed and the SiN layer is etched with the resist as a mask. A part of the SiN layer is left and an alignment mark is formed. The remaining resist is removed.

Subsequently, a different resist is applied on the basic layer 6A. Then, a two-dimensional minute pattern is drawn on the resist by an electron beam drawing device with the alignment mark as a basis and the resist is developed, whereby a two-dimensional minute pattern is formed on the resist. Then, a two-dimensional minute pattern with a depth around 100 nm is transferred, with the resist as a mask, to the basic layer 6A by dry etching. Subsequently, a through-hole (hole) is formed and the resist is removed. A depth of the through-hole is 100 nm. Into the through hole, a compound semiconductor to be a different-refractive-index region 6B (AlGaAs) is regrown in such a manner that the compound semiconductor becomes equal to or deeper than the through-hole. Then, the upper cladding layer (AlGaAs) 7 and the contact layer (GaAs) 8 are serially formed by the MOCVD and an arbitrary electrode material is formed on upper and lower surfaces of a substrate by an evaporation method or a spattering method, whereby first and second electrodes are formed. Also, when necessary, an insulation film can be formed on the upper and lower surfaces of the substrate by the spattering method or the like.

When the diffraction grating layer 6 is included in the lower part of the active layer, a diffraction grating layer is formed on the lower cladding layer before the active layer and the lower optical guide layer are formed.

In a case of the structure in FIG. 4, the quarter wave plate 26 is arranged on the semiconductor substrate 1 via, the insulation film 9 and the polarizer 27 is arranged on a surface of the contact layer 8.

In a case of the structure in each of FIG. 5 and FIG. 6, the following point is different. That is, it is not necessary to etch the cladding layer 2 and the conductive region E3 is formed on the semiconductor substrate 1 when necessary. The other parts can be formed by a similar production method.

As described in the above, according to the above-described device, light generated in the active layer is modulated by the diffraction grating layer, oscillated in a two-dimensional single mode. A part of the oscillated light is diffracted twice by the diffraction grating layer and enters the liquid crystal layer as a plane wave. Since a liquid crystal has refractive index anisotropy, an equivalent refractive index in a direction parallel with an optical output varies according to a rotation angle. Here, since a physical length of the liquid crystal layer is constant, an optical path length varies due to variation of a refractive index. Thus, when a plane wave enters the liquid crystal layer from a lower part, an optical path length in each pixel can be varied. In other words, when the plane wave enters the liquid crystal layer from the lower part, it is possible to vary a phase thereof in each pixel. Thus, it becomes possible to control a shape of an emission wave front. In such a manner, the laser beam oscillated in the two-dimensional single mode enters the liquid crystal layer as a plane wave. Then, a wave front a phase of which is modulated in each pixel is acquired as an optical output from the lower part.

Figure 9:
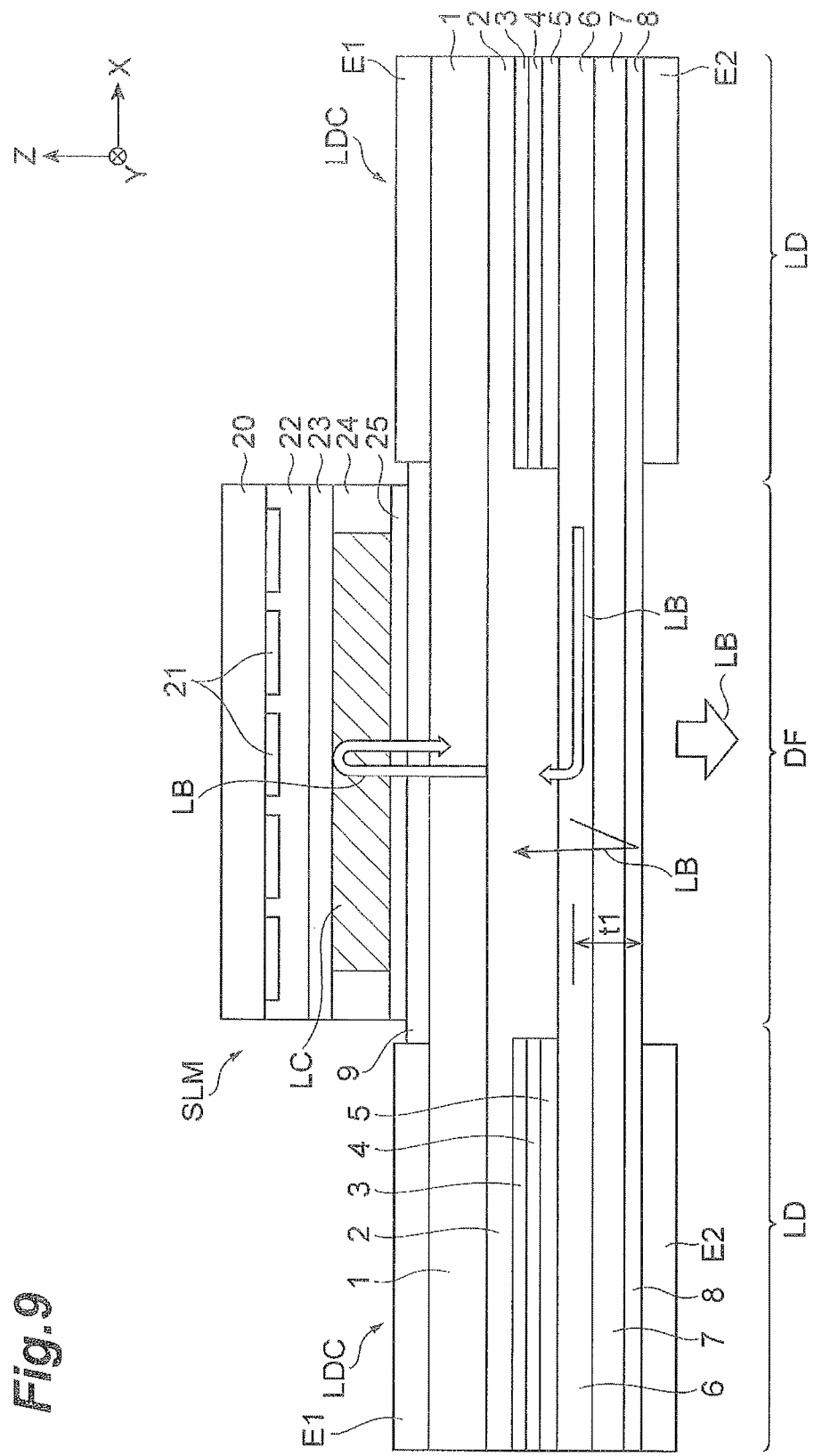
FIG. 9 is a vertical sectional view of a modification example of the semiconductor laser device illustrated in FIG. 3.

FIG. 9 is a vertical sectional view of a modification example of the semiconductor laser device illustrated in FIG. 3.

A difference between this semiconductor laser device and the semiconductor laser device illustrated in FIG. 3 is that a deflection region DF is surrounded by a laser beam generation region LD in a plan view in a Z-axis direction. The other configurations are identical. In a case of this structure, a laser beam generated in the laser beam generation region LD propagates in a horizontal direction (X-axis direction), reaches the deflection region DF, and is deflected in an upward direction (Z-axis direction) in the deflection region DF. Note that a row selection circuit and a column selection circuit are arranged in arbitrary positions.

Figure 10:
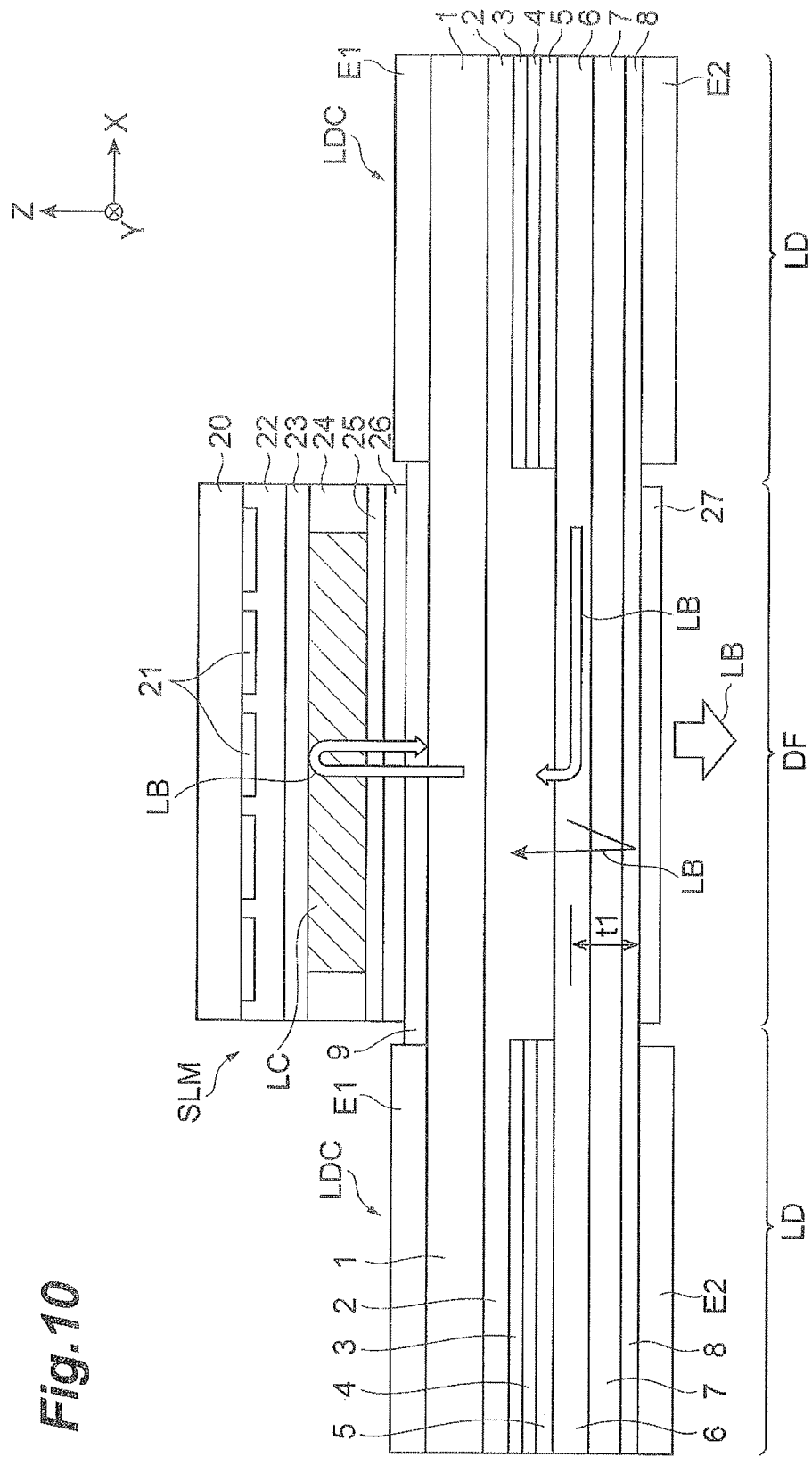
FIG. 10 is a vertical sectional view of a modification example of the semiconductor laser device illustrated in FIG. 4.

Similarly, FIG. 10 is a vertical sectional view of a modification example of the semiconductor laser device illustrated in FIG. 4.

A difference between this semiconductor laser device and the semiconductor laser device illustrated in FIG. 4 is that a deflection region DF is surrounded by a laser beam generation region LD in a plan view in a Z-axis direction. The other configurations are identical. In a case of this structure, a laser beam generated in the laser beam generation region LD also propagates in a horizontal direction (X-axis direction), reaches the deflection region DF, and is deflected in an upward direction (Z-axis direction) in the deflection region DF. Note that a row selection circuit and a column selection circuit are arranged in arbitrary positions.

Figure 11:
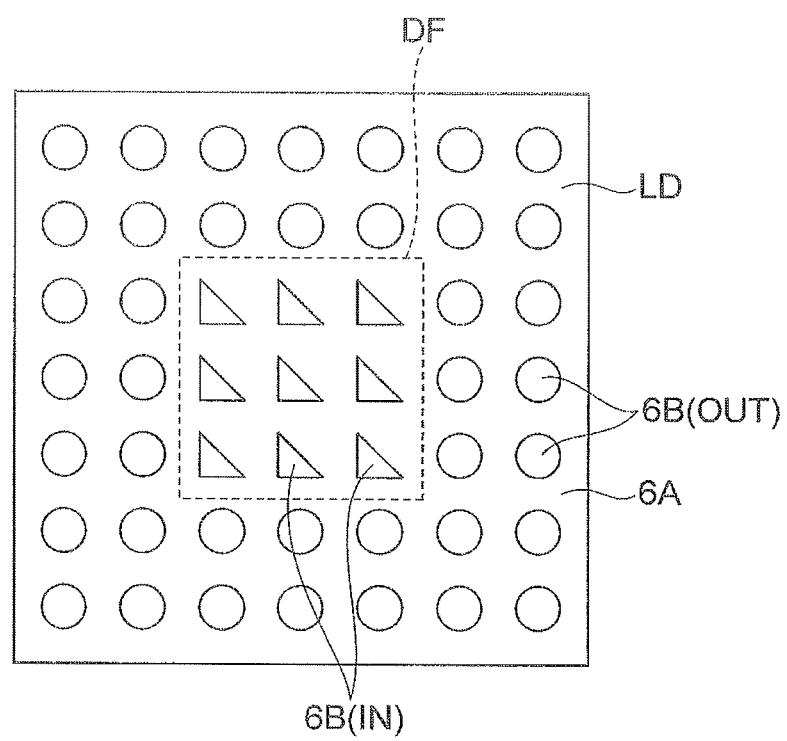
FIG. 11 is a plan view of a diffraction grating layer 6.

FIG. 11 is a plan view of a diffraction grating layer 6 applied to the structure of each of FIG. 9 and FIG. 10.

As described above, the deflection region DF is surrounded by the laser beam generation region LD. Here, a different-refractive-index region 6B (IN) in the deflection region DF and a different-refractive-index region 6B (OUT) in the laser beam generation region LD have different planar shapes.

The diffraction grating layer 6 includes a basic layer 6A and the different-refractive-index region 6B. The different-refractive-index region 6B is embedded into the basic layer 6A for a predetermined depth and has a refractive index different from that of the basic layer 6A. In the drawing, a planar shape of the inner different-refractive-index region 6B (IN) is illustrated as a triangle (right triangle) and that of the outer different-refractive-index region 6B (OUT) is illustrated as a circle.

In other words, the planar shape of the inner different-refractive-index region GB (IN) is a rotationally-asymmetric figure around the Z-axis and the planar shape of the outer different-refractive-index region 6B (OUT) is a rotationally-symmetric figure around the Z-axis or a figure with an arbitrary shape.

Also, the above-described different-refractive-index region 6B is arranged at a lattice point in a lattice on an XY plane.

In FIG. 11, a case where the lattice is a square lattice is illustrated. Here, a value which is a distance between through-holes, which distance is divided by an equivalent refractive index, is around a wavelength and oscillation at a point Γ in a reciprocal lattice space is acquired. In the oscillation at the point Γ, light is diffracted not only in a direction of the XY plane but also in a Z-direction. In order to keep utilization efficiency of light high, it is preferable that the light is not propagated in the Z-direction in the light source part (laser beam generation region LD). In order to realize this, a planar shape of the different-refractive-index region 6B (OUT) which functions as a light source part is preferably a rotationally-symmetric shape. That is, the point Γ in the square lattice can be used as a planar shape of the different-refractive-index region 6B (OUT) which functions as a light source part. In this case, a shape of a through-hole is preferably a rotationally-symmetric shape.

On the other hand, when a value which is a distance between through-holes in the square lattice structure, which distance is multiplied by an equivalent refractive index, is set to be $2^{-1/2}$ times larger than a wavelength, oscillation at a point M in a reciprocal lattice space is acquired. In the oscillation at the point M, light is diffracted in the direction of the XY plane but is not diffracted in the Z-direction. Thus, a planar shape of the different-refractive-index region 6B (OUT) which functions as the light source part may be an arbitrary shape. That is, the point M in the square lattice can be used as a planar shape of the different-refractive-index region 6B (OUT) which functions as the light source part. In this case, a shape of a through-hole may be an arbitrary shape.

On the other hand, when a value which is a distance between through-holes in the triangle lattice structure which distance is multiplied by an equivalent refractive index is set around a wavelength, oscillation at a point Γ in a reciprocal lattice space is acquired. In the oscillation at the point Γ, light is diffracted not only in the direction of the XY plane but also in the Z-direction. In order to keep utilization efficiency of light high, it is preferable that the light is not propagated in the Z-direction in the light source part. In order to realize this, a planar shape of the different-refractive-index region 6B (OUT) which functions as a light source part is preferably a rotationally-symmetric shape. That is, the point F in the triangle lattice can be used as a planar shape of the different-refractive-index region 6B (OUT) which functions as a light source part. In this case, a shape of a through-hole is preferably a rotationally-symmetric shape.

Also, when a value which is a distance between the through-holes in the triangle lattice structure which distance is multiplied by the equivalent refractive index is set to be $2 \times 3^{-1/2}$ times larger than a wavelength, oscillation at a point J in a reciprocal lattice space is acquired. In the oscillation at the point J, light is diffracted in the direction of the XY plane but is not diffracted in the Z-direction. Thus, a planar shape of the different-refractive-index region 6B (OUT) which functions as the light source part may be arbitrary shape. That is, the point J in the triangle lattice can be used as a planar shape of the different-refractive-index region 6B (OUT) which functions as the light source part. In this case, a shape of a through-hole can be an arbitrary shape.

A planar shape of the different-refractive-index region 6B (IN) on an inner side, which region performs extraction and modulation of light, is a rotationally-asymmetric shape regardless of a planar shape of the outer different-refractive-index region 6B (OUT). The inner different-refractive-index region 6B (IN) can be arranged in such a manner that a value which is a distance between through-holes, which distance is multiplied by the equivalent refractive index, in the square lattice or the triangle lattice becomes around a wavelength. Here, oscillation at a point Γ in a photonic band of a photonic crystal is acquired. In the oscillation at the point Γ, light is diffracted not only in the direction of the XY plane but also in the Z-direction. Here, by making a shape of a through-hole rotationally asymmetric, it is possible to extract light efficiently.

As described above, the semiconductor laser chip includes the laser beam generation region LD in which the active layer is formed, and the deflection region DF which is adjacent to the laser beam generation region LD and which deflects a laser beam. The diffraction grating layer 6 is extended in such a manner as to be placed in both of the laser beam generation region LD and the deflection region DF. The deflection region DF is surrounded by the laser beam generation region LD and can efficiently deflect a laser beam generated in the surrounding.

Also, the diffraction grating layer 6 includes the basic layer 6A and the plurality of different-refractive-index regions 6B which is periodically formed in the basic layer 6A and which includes a refractive index different from that of the basic layer 6A. A planar shape of each of the different-refractive-index regions 6B in the diffraction grating layer 6 in the deflection region DF is rotationally asymmetric and is, for example, triangular when seen in the Z-axis direction, as illustrated in FIG. 11. Thus, the above-described effect can be acquired.

REFERENCE SIGNS LIST

SLM spatial light modulator
LDC semiconductor laser chip
4 active layer
2, 7 cladding layer
6 diffraction grating layer

The invention claimed is:

1. A semiconductor laser device comprising:
a semiconductor laser chip; and
a spatial light modulator which is optically connected to the semiconductor laser chip, wherein
the semiconductor laser chip includes:
    an active layer,
    a pair of cladding layers sandwiching the active layer,
    a diffraction grating layer which is optically connected to the active layer, and
    a laser beam generation region in which the active layer is formed;
wherein
the diffraction grating layer is sandwiched by the cladding layers;
the diffraction grating layer is a photonic crystal that has a periodic structure in which a refractive index is two-dimensionally varied;
the diffraction grating layer includes:
    a basic layer and
    a different-refractive-index region being embedded into the basic layer for a predetermined depth and has a refractive index different therefrom,
    wherein the different-refractive-index region is arranged at a lattice position of a square lattice or of a triangle lattice;
the diffraction grating layer is placed in the laser beam generation region and emits the laser beam in the thickness direction of the diffraction grating layer;
the spatial light modulator is attached to the laser beam generation region; and
the spatial light modulator includes:
    a common electrode,
    a plurality of pixel electrodes, and
    a liquid crystal layer arranged between the common electrode and the pixel electrodes,
the spatial light modulator being attached to the semiconductor laser chip in such a manner that a laser beam output in a thickness direction of the diffraction grating layer is input through a transparent one of the common electrode and the pixel electrodes,
    modulating a phase of the laser beam with a driving voltage applied between the pixel electrodes and the common electrode, and
    reflecting and outputting, to the outside, the laser beam the phase of which is modulated.

2. The semiconductor laser device according to claim 1, further comprising a selection circuit which is arranged on the semiconductor laser chip and which is configured to supply the driving voltage selectively between a pixel electrode at an intended address and the common electrode.

3. The semiconductor laser device according to claim 1, further comprising a storage device configured to store an initial correction value of the driving voltage in each of the pixel electrodes.

4. The semiconductor laser device according to claim 1, further comprising a quarter wave plate arranged between the semiconductor laser chip and the spatial light modulator, and
a polarizer provided on a surface of the semiconductor laser chip which surface is on an opposite side of the spatial light modulator.

5. The semiconductor laser device according to claim 1, wherein a plurality of the different-refractive-index regions are periodically formed in the basic layer, and a planar shape of each of the different-refractive-index regions in the diffraction grating layer in the deflection region is rotationally asymmetric.

6. A semiconductor laser device comprising:

a semiconductor laser chip; and a spatial light modulator which is optically connected to the semiconductor laser chip, wherein the semiconductor laser chip includes:
- an active layer,
- a pair of cladding layers sandwiching the active layer,
- a diffraction grating layer which is optically connected to the active layer, and
- a laser beam generation region in which the active layer is formed;
- a deflection region which is adjacent to the laser beam generation region and which is configured to deflect the laser beam, wherein the diffraction grating layer is sandwiched by the cladding layers;

the diffraction grating layer is a photonic crystal that has a periodic structure in which a refractive index is two-dimensionally varied;

the diffraction grating layer includes:
- a basic layer and
- a different-refractive-index region being embedded into the basic layer for a predetermined depth and has a refractive index different therefrom,
  wherein the different-refractive-index region is arranged at a lattice position of a square lattice or of a triangle lattice;

the diffraction grating layer is extended in such a manner as to be placed in both of the laser beam generation region and the deflection region, and the deflection region is surrounded by the laser beam generation region, the spatial light modulator is attached to the deflection region; and the spatial light modulator includes:
- a common electrode,
- a plurality of pixel electrodes, and
- a liquid crystal layer arranged between the common electrode and the pixel electrodes, the spatial light modulator being attached to the semiconductor laser chip in such a manner that a laser beam output in a thickness direction of the diffraction grating layer is input through transparent one of the common electrode and the pixel electrodes, modulating a phase of the laser beam with a driving voltage applied between the pixel electrodes and the common electrode, and reflecting and outputting, to the outside, the laser beam the phase of which is modulated.

7. The semiconductor laser device according to claim 6, further comprising a selection circuit which is arranged on the semiconductor laser chip and which is configured to supply the driving voltage selectively between a pixel electrode at an intended address and the common electrode.

8. The semiconductor laser device according to claim 6, further comprising a storage device configured to store an initial correction value of the driving voltage in each of the pixel electrodes.

9. The semiconductor laser device according to claim 6, further comprising a quarter wave plate arranged between the semiconductor laser chip and the spatial light modulator, and a polarizer provided on a surface of the semiconductor laser chip which surface is on an opposite side of the spatial light modulator.

10. The semiconductor laser device according to claim 6, wherein a plurality of the different-refractive-index regions are periodically formed in the basic layer, and a planar shape of each of the different-refractive-index regions in the diffraction grating layer in the deflection region is rotationally asymmetric.

* * * * *